(12) United States Patent
Chun

(10) Patent No.: US 9,842,837 B2
(45) Date of Patent: Dec. 12, 2017

(54) SEMICONDUCTOR DEVICE

(71) Applicant: SK hynix Inc., Gyeonggi-do (KR)

(72) Inventor: Duk Su Chun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/040,703

(22) Filed: Feb. 10, 2016

(65) Prior Publication Data

US 2017/0062417 A1 Mar. 2, 2017

(30) Foreign Application Priority Data

Aug. 26, 2015 (KR) .................. 10-2015-0120033

(51) Int. Cl.
*H01L 27/088* (2006.01)
*H01L 23/528* (2006.01)

(52) U.S. Cl.
CPC .......... *H01L 27/088* (2013.01); *H01L 23/528* (2013.01)

(58) Field of Classification Search
CPC ........................ H01L 27/088; H01L 23/528
See application file for complete search history.

(56) References Cited

U.S. PATENT DOCUMENTS

| 6,455,894 B1 * | 9/2002 | Matsumoto | H01L 21/84 257/347 |
| 6,465,768 B1 * | 10/2002 | Ker | H01L 21/823842 250/214.1 |
| 6,683,351 B2 * | 1/2004 | Morita | H01L 27/0629 257/355 |
| 7,692,252 B2 * | 4/2010 | Sato | H01L 27/0207 257/318 |
| 8,957,480 B2 * | 2/2015 | Deguchi | H01L 21/823425 257/368 |
| 2011/0089534 A1 | 4/2011 | Lee et al. | |
| 2017/0140812 A1 * | 5/2017 | Yamamoto | G11C 11/419 |

FOREIGN PATENT DOCUMENTS

KR 1020110002180 1/2011

* cited by examiner

*Primary Examiner* — Allison P Bernstein
(74) *Attorney, Agent, or Firm* — IP & T Group LLP

(57) ABSTRACT

Disclosed is a semiconductor device including a plurality of conductive patterns formed on a semiconductor substrate while being spaced apart from one another at a preset interval and extending in a first direction, and a plurality of junction areas formed by doping impurities in the semiconductor substrate and provided between the conductive patterns. The plurality of junction areas includes transistor junction areas and dummy junction areas. Each of the transistor junction areas is connected through a contact to a source/drain electrode, and the contact is formed at a higher level than the transistor junction areas. Each of the dummy junction areas is connected to a bias contact formed at higher level than the dummy junction areas. A well bias voltage is applied to the dummy junction areas through the bias contact.

11 Claims, 4 Drawing Sheets

SEMICONDUCTOR DEVICE

CROSS-REFERENCES TO RELATED APPLICATION

The present application claims priority under 35 U.S.C. §119(a) to Korean application number 10-2015-0120033, filed on Aug. 26, 2015 which is herein incorporated by reference in its entirety.

BACKGROUND

1. Technical Field

Various embodiments generally relate to a semiconductor device.

2. Related Art

A semiconductor device may be realized by configuring a circuit by connecting transistors to one another. When the semiconductor device is formed on a semiconductor substrate, a plurality of transistors, interconnections for connecting them to one another, and the like may be formed in repetitive patterns. The interconnections for a predetermined function are arranged and a dummy pattern is formed in a remaining area.

SUMMARY

Various embodiments are directed to a semiconductor device having improved operational stability for its transistors. The semiconductor device comprises a dummy pattern formed on a semiconductor substrate. A well bias voltage may also be provided through the dummy pattern. The invention allows further reductions in the size of semiconductor devices to be obtained.

In an embodiment, a semiconductor device may include a plurality of conductive patterns formed on a semiconductor substrate, spaced apart from one another at a preset interval and extending in a first direction, and a plurality of junction areas formed by doping impurities in the semiconductor substrate and provided between the conductive patterns. The plurality of junction areas includes transistor junction areas and dummy junction areas. Each of the transistor junction areas is connected through a contact to a source/drain electrode. The contact is formed at a higher level than the transistor junction areas. Each of the dummy junction areas is connected to a bias contact. The bias contact is formed at a higher level than the dummy junction areas. A well bias voltage is applied to the dummy junction areas through the dummy bias contact.

In an embodiment, a semiconductor device may include logic array areas including a transistors and a dummy area including a dummy active area and gate dummy patterns. Each of the transistors has an active area, a gate pattern, and a source and a drain. The gate pattern is formed over the active area, and each of the source and the drain is adjacent to the gate pattern. The dummy active area is formed between the logic array areas, and the gate dummy patterns are formed over the dummy active area. Each of the gate dummy patterns extends in a first direction, and the first direction is substantially the same as a direction in which the gate pattern extends. A well bias voltage is applied to the dummy active area.

According to the embodiments, since the semiconductor device does not include a separate guard ring in order to provide a well bias voltage and utilizes an existing dummy pattern for the purpose of the stabilization of patterns, it is possible to minimize an area required for realizing an entire circuit.

According to the embodiments, the semiconductor device utilizes an existing dummy pattern in order to apply a well bias voltage to transistors, and thus it is possible to easily ensure a space for interconnections for configuring a circuit through connections among the transistors.

DETAILED DESCRIPTION

Hereinafter, a semiconductor device will be described with reference to the accompanying drawings, according to various embodiments of the invention.

Figure 1:
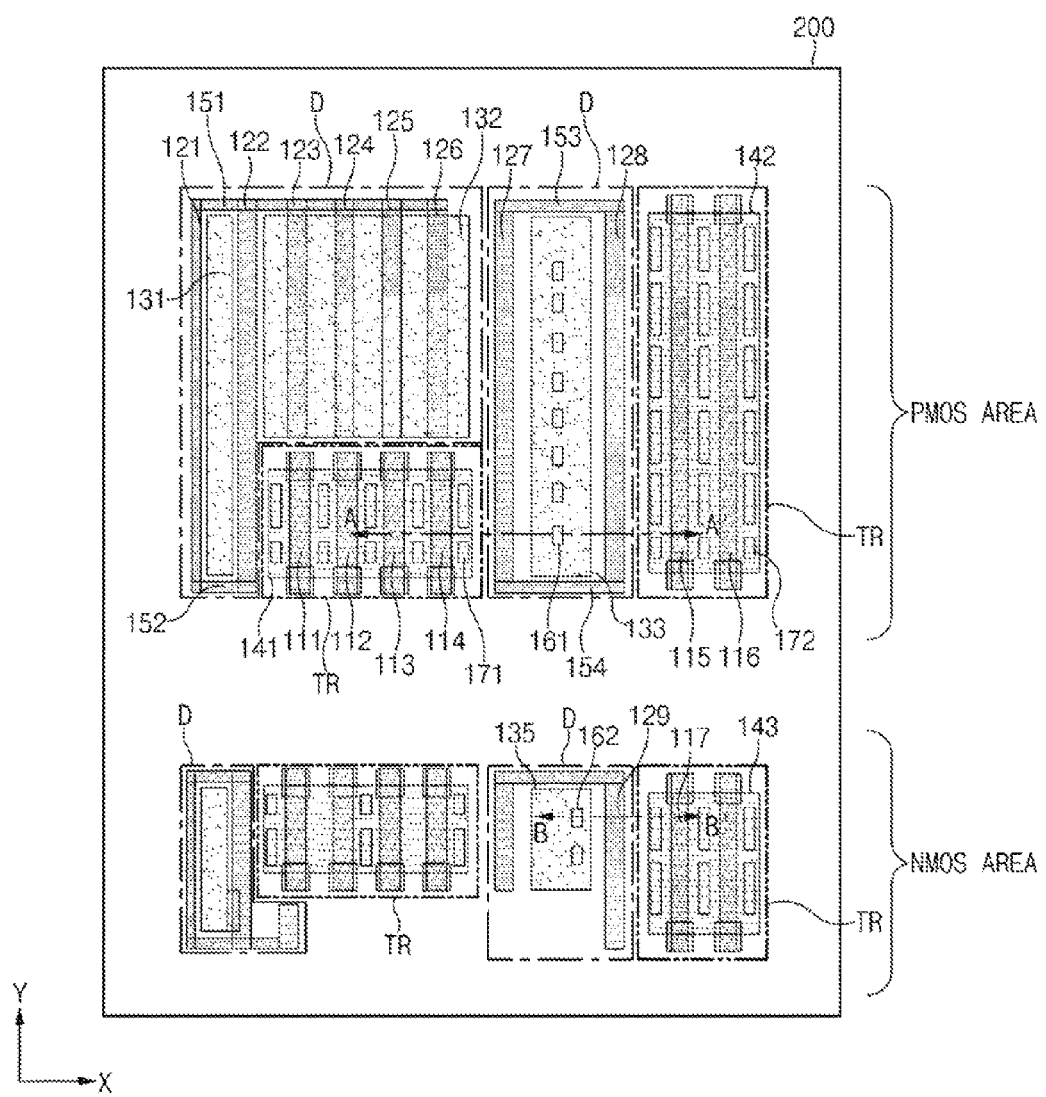
FIG. 1 is a plan view illustrating a semiconductor device, according to an embodiment of the present invention.

Referring to FIG. 1, the semiconductor device may include a plurality of conductive patterns 111 to 117 and 121 to 129, respectively. The semiconductor device may also include a plurality of active areas 131 to 133 and 135, 141 to 143 extending between the plurality of conductive patterns 111 to 117 and 121 to 129. The plurality of active areas 131 to 133, 141 to 143 may include junction areas located between the plurality of conductive patterns 111 to 117 and 121 to 129. The junction areas may be doped with specific conductive impurities.

The plurality of conductive patterns 111 to 117 and 121 to 129 may be formed as elongated stripes or lines on a semiconductor substrate 200, spaced apart from one another at a preset interval in a first direction X, and extending in a second direction Y that is perpendicular to the first direction X. The plurality of conductive patterns 111 to 117 and 121 to 129 may include first conductive patterns 111 to 117 and second conductive patterns 121 to 129. The plurality of conductive patterns 111 to 117 and 121 to 129 may be formed with a polysilicon pattern or a metallic pattern, or by stacking polysilicon and a metal layer.

The plurality of first conductive patterns 111 to 117 may form gate patterns 111 to 117 which may be connected to gate electrodes.

The plurality of active areas 131 to 133 and 135, 141 to 143 includes dummy active areas 131 to 133 and 135 and active areas 141 to 143. In the active areas 141 to 143 where the gate patterns 111 to 117 are formed, transistor junction areas may be formed between the gate patterns 111 to 117. The transistor junction areas may be connected to at least a source or a drain electrode through contacts 171 and 172 formed at the upper portions thereof, thereby defining a plurality of transistors together with the gate patterns 111 to 117. Since the transistor may comprise various logic circuits, the gate patterns 111 to 117 and the transistor junction areas (that is, areas connected to at least a source or a drain electrode serving as sources and/or drains) adjacent to the gate patterns 111 to 117 may also be referred to hereinafter as logic array areas TR. For example, the transistor junction regions formed within the active areas 141 to 143 and located between the gate patterns 111 to 117. (See FIGS. 2 and 3)

Some of the conductive patterns, for example the second conductive patterns may define gate dummy patterns 121 to 129. Active areas formed below the gate dummy patterns 121 to 129 may be referred to as dummy active areas 131 to 133 and 135. The dummy active areas 131 to 133 and 135 may include dummy junction areas doped with specific conductive impurities. According to an embodiment, the dummy junction areas may be doped with impurities having different conductivity from the impurities used for the transistor junction areas. For example, the dummy junction areas may be formed within the dummy active areas 131 to 133 and 135 and located between the gate dummy patterns 121 to 129.

Areas of the semiconductor substrate 200 other than logic array areas TR may be filled with the gate dummy patterns 121 to 129 and the dummy active areas 131 to 133 and 135. In this way stability of the pattern including structural and/or functional stability may be improved. Hereinafter, an area where a gate dummy pattern 121 to 129 and/or a dummy active area 131 to 133 and 135 is formed may also be referred to as a dummy area D.

A gate dummy pattern 121 to 129 and/or a dummy active area 131 to 133 and 135 may be a cell-like pattern.

A plurality of Dummy areas D may be formed between the logic array areas TR. Because the dummy areas D fills remained region of the logic array areas TR, the dummy areas D may provide stability to the entire semiconductor device. For example, the dummy areas D may support adjacent logic array areas TR. The entire semiconductor memory device may be designed with regularity by including the dummy areas D and the logic array areas TR which has substantially the same conductive patterns 111 to 117 and 121 to 129. This is advantageous and may allow further reductions in the size of semiconductor devices. Reducing the size of existing semiconductor devices including only conductive patterns and not dummy patterns is limited by the need to space apart the conductive areas at a predetermined interval due to limitations in related exposure equipment employed for the fabrication of semiconductor devices. The present invention may overcome this limitation by adding a plurality of dummy areas D between the logic areas TR.

The dummy junction areas included in the semiconductor device according to an embodiment of the invention may receive a well bias voltage, for example through bias contacts 161 and 162 formed at the upper portions of the dummy junction areas.

For example, the well bias voltage may be applied through a dummy junction area included in the dummy area D. The gate dummy patterns 121 to 129 may be floated. It is noted, however, that the invention may not be limited in this way, For example, the gate dummy patterns 121 to 129 may not be floated that is, and any voltage is applied to the gate dummy patterns 121 to 129.

Referring to FIG. 1, on the semiconductor substrate 200, a PMOS area and a NMOS area are separately illustrated. For example, when the semiconductor substrate 200 is a P type substrate, the PMOS area may be formed on an N-WELL. A well bias voltage may be applied to all N-WELL areas through the well bias voltage provided through a bias contact 161 of the PMOS area. The well bias voltage may be applied to the entire semiconductor substrate 200 through the bias contact 162 of the NMOS area.

Accordingly, the logic array areas TR formed in the PMOS and NMOS areas may stably operate through a well bias voltage. Moreover, it is noted that additional elements are not required to provide the well bias voltage, and since it is possible to apply the well bias voltage through the dummy area D required for stabilizing patterns between the logic array areas TR, further reductions in the size of semiconductor devices may obtained.

The semiconductor substrate 200 may be or include any suitable material. For example, the semiconductor substrate 200 may include a silicon substrate, a SOI (Silicon on Insulator) substrate, a GaAs substrate, a SiGe substrate, a ceramic substrate, a quartz substrate, a glass substrate for display, and the like.

For example, when an N-WELL is formed by implanting n type impurities such as phosphorous (P) or arsenic (As) into the PMOS area of the semiconductor substrate 200, the transistor junction areas included in the active areas 141 to 143 may be formed by implanting p type impurities. The dummy junction areas included in the dummy active areas 131 to 133 and 135 may be formed by implanting n type impurities.

The semiconductor device may include dummy connection patterns 151 to 154 which are formed in a direction crossing an extension direction of the gate dummy patterns 121 to 129 and connect the gate dummy patterns 121 to 129 to one another.

Figure 2:
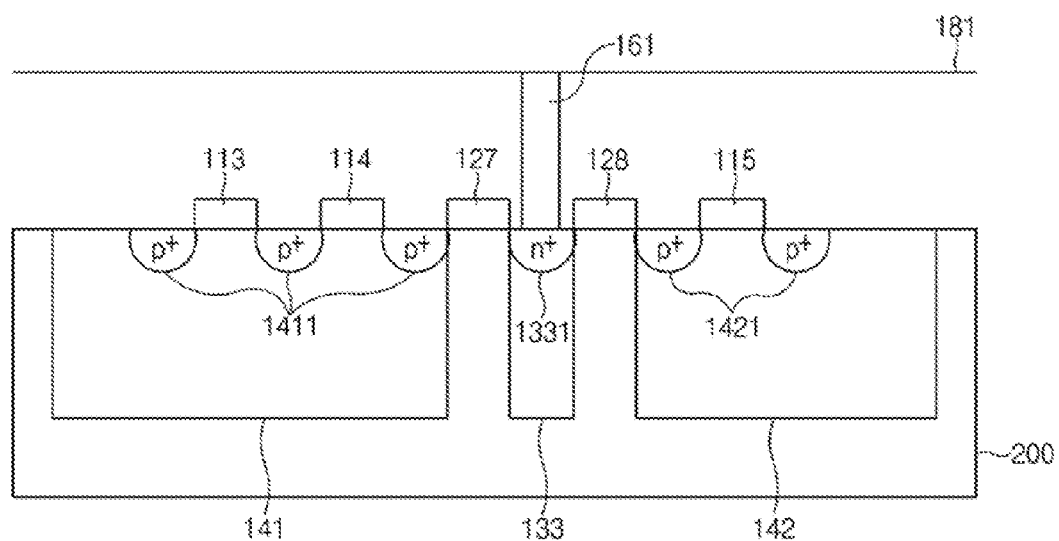
FIG. 2 and FIG. 3 are sectional views illustrating a semiconductor device, according to an embodiment of the present invention.

FIG. 2 is a sectional view of the semiconductor device of FIG. 1 taken along line A-A'. Referring to FIG. 2, the dummy active area 133, the active areas 141 and 142, the gate patterns 113 to 115, the gate dummy patterns 127 and 128, the bias contact 161, and a bias voltage pattern 181 are formed on the semiconductor substrate 200.

The bias voltage pattern 181 is a pattern for providing a well bias voltage and may be formed at a position higher than the gate patterns 113 to 115 and the gate dummy patterns 127 and 128.

A well bias voltage may be applied to the N-WELL through a dummy junction area 1311 formed in the dummy active area 133 via the bias voltage pattern 181 and bias contact 161.

The transistor junction areas 1411 may be formed within the active area 141 and the transistor junction areas 1421 may be formed within the active area 142.

According to various embodiments, the dummy junction area 1331 may not be formed in the dummy active area 133, and the well bias voltage may be directly applied to the dummy active area 133. Alternatively, the dummy active area 133 may correspond to the dummy isolation area.

Figure 3:
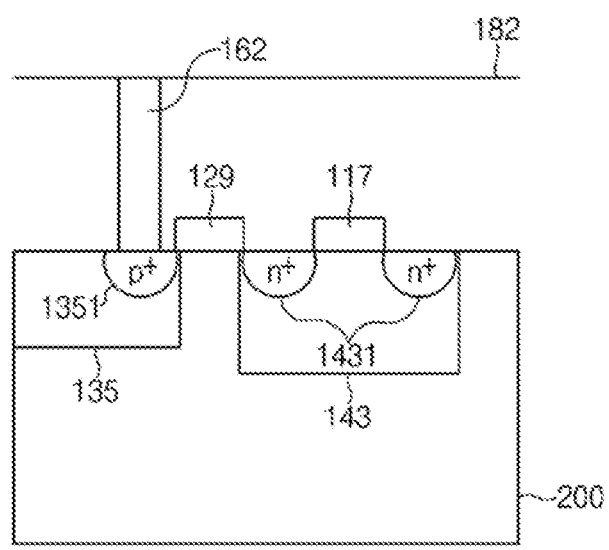

FIG. 3 is a sectional view of the semiconductor device of FIG. 1, which is taken along line B-B'. Referring to FIG. 3, the dummy active area 135, the active area 143, the gate pattern 117, the gate dummy patterns 129, the bias contact 162, and a bias voltage pattern 182 are formed on the semiconductor substrate 200.

The well bias voltage applied through the bias voltage pattern 182 may be provided to the semiconductor substrate 200 through the bias contact 162. More specifically, the well bias voltage may be applied through dummy junction area 1351 formed within the dummy active area 135. The well bias voltage applied to the bias voltage pattern 182 may have a value different from that of the well bias voltage applied through the bias voltage pattern 181 of FIG. 2.

According to various embodiments, the dummy junction area 1351 may not be formed in the dummy active area 135, and thus the well bias voltage may be directly provided to the dummy active area 135. For example, the transistor junction areas 1431 may be formed within the active area 143.

The bias voltage pattern 182 may be formed at a position higher than the gate pattern 117 and the gate dummy patterns 129.

Figure 4:
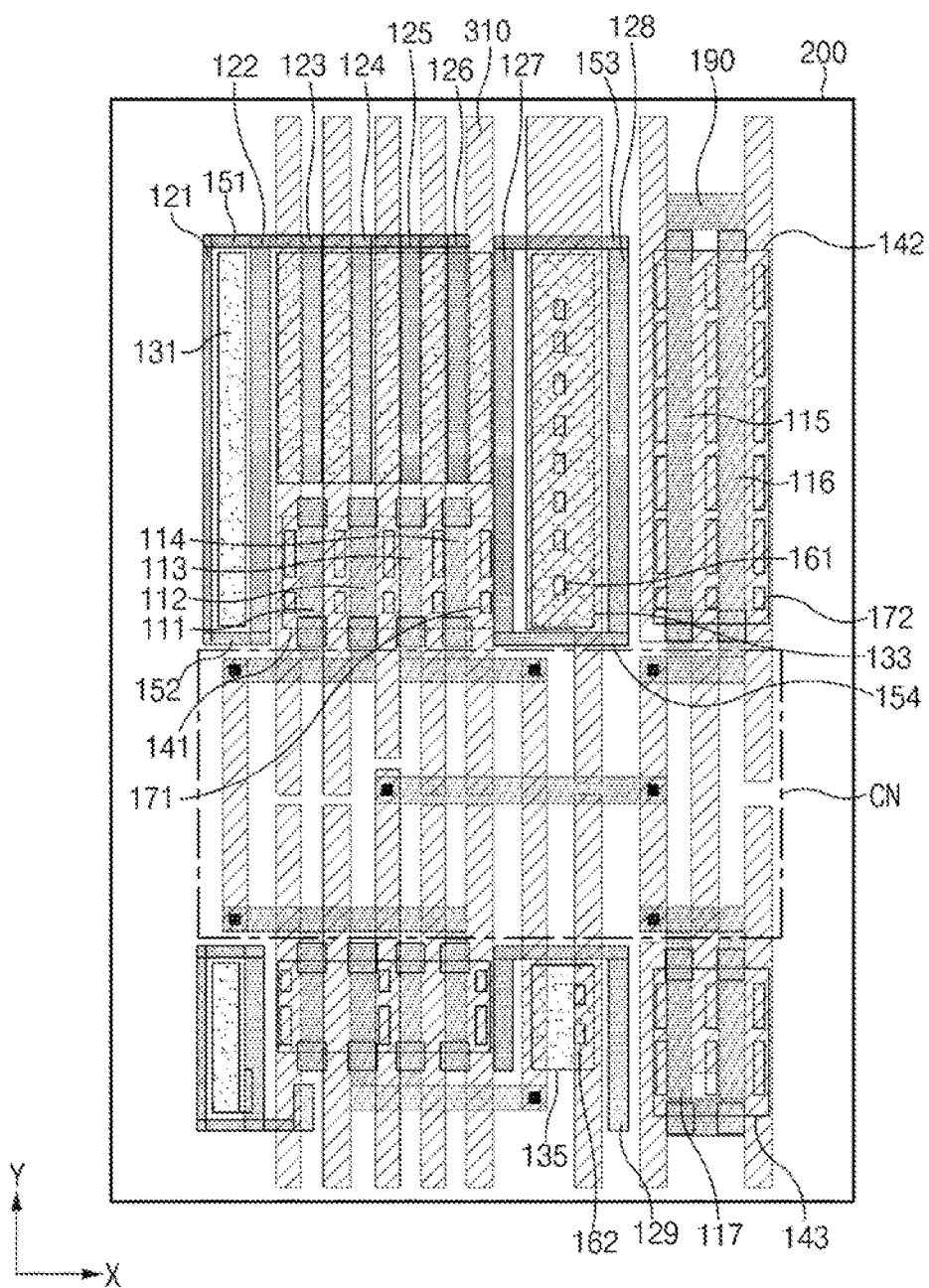
FIG. 4 is a plan view illustrating a semiconductor device, according to an embodiment of the present invention.

FIG. 4 is a plan view illustrating a semiconductor device according to an embodiment of the present invention. FIG. 4 illustrates an embodiment in which a logic circuit is configured by connecting transistors of the transistor area TR formed in FIG. 3 to one another.

The semiconductor device illustrated in FIG. 4 includes additional elements compared with the semiconductor device illustrated in FIG. 3. Hereinafter, a detailed description of the configuration regarding the same elements as described in FIG. 3 will be omitted.

The semiconductor device may include a plurality of conductive patterns 111 to 117 and 121 to 129, respectively. The semiconductor device may also include a plurality of active areas 131 to 133 and 135, 141 to 143 extending between the plurality of conductive patterns 111 to 117 and 121 to 129. The plurality of active areas 131 to 133 and 135, 141 to 143 may include junction areas located between the plurality of conductive patterns 111 to 117 and 121 to 129. The junction areas may be doped with specific conductive impurities.

The semiconductor device may include dummy connection patterns 151 to 154 which are formed in a direction crossing an extension direction of the gate dummy patterns 121 to 129 and connect the gate dummy patterns 121 to 129 to one another.

The semiconductor device may include bias contacts 161 and 162 formed at the upper portions of the dummy junction regions formed within the dummy active areas 131 to 133 and 135 and located between the gate dummy patterns 121 to 129. The semiconductor device may include contacts 171 and 172 which connect at least a source or drain electrodes formed in the transistor junction areas.

Referring to FIG. 4, a first connection pattern 310 is formed above the plurality of conductive patterns 111 to 117 and 121 to 129 shown in FIG. 3, and a second connection pattern 190 for connecting the gate patterns 111 to 117 to one another is formed.

The gate patterns 111 to 117 formed in the transistor area TR are connected to one another through the second connection pattern 190, and the transistors formed in the NMOS area and the transistors formed in the PMOS area are connected to one another through the first connection pattern 310, so that various logic circuits may be configured.

For example, the transistors may be connected to one another as illustrated in FIG. 4 so that various logic circuits such as an inverter, a NAND, and a NOR may be configured.

While various embodiments have been described above, it will be understood that the embodiments described are by way of example only. Accordingly, the invention should not be limited based on the described embodiments and many more variations and embodiments may become apparent to those skilled in this art after having read the present disclosure without departing from the spirit and scope of the invention as defined by the appended claims.

What is claimed is:

1. A semiconductor device comprising:
    a plurality of conductive patterns formed on a semiconductor substrate, spaced apart from one another at a preset interval and extending in a first direction; and
    a plurality of junction areas formed by doping impurities in the semiconductor substrate and provided between the conductive patterns,
    wherein the plurality of junction areas include transistor junction areas and dummy junction areas,
    wherein each of the transistor junction areas is connected through a contact to a source/drain electrode,
    wherein each of the dummy junction areas is connected to a bias contact,
    wherein the bias contact is formed at a higher level than the dummy junction areas,
    wherein a well bias voltage is applied to the dummy junction areas through the bias contact,
    wherein the plurality of the conductive patterns includes gate patterns fon ed between the transistor junction areas, connected to a gate electrode and configuring transistors together with the transistor junction areas,
    wherein the transistors are connected to one another to configure at least one of an inverter, an NAND operator and an NOR operator,
    wherein the substrate includes an active area and a dummy active area,
    wherein the transistors are formed in the active area,
    wherein the dummy junction areas are formed in the dummy active area,
    wherein the plurality of the conductive patterns further comprise gate dummy patterns, and
    wherein the gate dummy patterns are positioned in the dummy active area and are provided between the dummy junction areas, are in a floating state.

2. The semiconductor device of claim 1,
    wherein the dummy junction area and the transistor junction area are doped with different conductive impurities.

3. The semiconductor device of claim 2, further comprising:
    a bias voltage pattern formed over the semiconductor substrate and providing the well bias voltage through the bias contact to the dummy junction area.

4. The semiconductor device of claim 3,
    wherein the bias voltage pattern is formed at a level higher than the conductive patterns.

5. The semiconductor device of claim 1, further comprising:
    a dummy connection pattern extending in a second direction crossing the first direction and connecting the gate dummy patterns to one another.

6. A semiconductor device comprising:
    logic array areas including transistors, wherein each of the transistors has an active area, a gate pattern, and a source and a drain, wherein the gate pattern is formed over the active area, wherein each of the source and the drain is adjacent to the gate pattern; and
    a dummy area including a dummy active area and gate dummy patterns, wherein the dummy active area is formed between the logic array areas, wherein the gate dummy patterns are formed over the dummy active area, wherein each of the gate dummy patterns extends in a first direction, wherein the first direction substantially the same as a direction in which the gate pattern extends,
    wherein a well bias voltage is applied to the dummy active area,
    wherein the transistors are connected to one another to configure at least one of an inverter, an NAND operator and an NOR operator, and
    wherein the gate dummy patterns are in a floating state.

7. The semiconductor device of claim 6,
    wherein the dummy area includes a dummy junction area in the dummy active area, and
    wherein the dummy junction area is doped with a conductivity different from the source and the drain.

8. The semiconductor device of claim 7, further comprising:
a bias voltage pattern,
wherein the well bias voltage is provided to the bias voltage pattern through a bias contact, and
wherein the bias contact is formed in the dummy junction area.

9. The semiconductor device of claim 6,
wherein the gate pattern and the gate dummy patterns are extended with the same direction and arranged at substantially the same interval.

10. The semiconductor device of claim 6, further comprising:
a dummy connection pattern that connects the gate dummy patterns to one another.

11. The semiconductor device of claim 6, wherein the gate pattern included in the each of the transistors is connected to one another gate pattern included in the each of the transistors to configure a logic circuit.

* * * * *